United States Patent
Römer et al.

(10) Patent No.: US 10,190,046 B2
(45) Date of Patent: Jan. 29, 2019

(54) LUMINESCENT-SUBSTANCE MIXTURE, LIGHT-EMITTING SEMICONDUCTOR COMPONENT HAVING A LUMINESCENT-SUBSTANCE MIXTURE, AND STREETLAMP HAVING A LUMINESCENT-SUBSTANCE MIXTURE

(71) Applicant: OSRAM Opto Semiconductors GmbH, Regensburg (DE)

(72) Inventors: Rebecca Römer, Regensburg (DE); Barbara Huckenbeck, Augsburg (DE); Stefan Lange, Augsburg (DE); Hailing Cui, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 222 days.

(21) Appl. No.: 15/101,094

(22) PCT Filed: Nov. 18, 2014

(86) PCT No.: PCT/EP2014/074911
§ 371 (c)(1),
(2) Date: Jun. 2, 2016

(87) PCT Pub. No.: WO2015/082209
PCT Pub. Date: Jun. 11, 2015

(65) Prior Publication Data
US 2016/0304780 A1  Oct. 20, 2016

(30) Foreign Application Priority Data
Dec. 3, 2013 (DE) .................. 10 2013 113 382

(51) Int. Cl.
*C09K 11/77* (2006.01)
*F21S 8/08* (2006.01)
(Continued)

(52) U.S. Cl.
CPC ...... *C09K 11/7774* (2013.01); *C09K 11/0883* (2013.01); *C09K 11/7721* (2013.01);
(Continued)

(58) Field of Classification Search
None
See application file for complete search history.

(56) References Cited

U.S. PATENT DOCUMENTS 8,441,179 B2 * 5/2013 Pickard ................. H01L 33/504
313/485
2009/0189514 A1 * 7/2009 Hiramatsu ......... C09K 11/7734
313/503
(Continued)

FOREIGN PATENT DOCUMENTS

DE    10 2009 032 711 A1    1/2011
DE    10 2009 037 732 A1    2/2011
(Continued)

OTHER PUBLICATIONS

First Office Action dated Feb. 20, 2017, of corresponding Chinese Application No. 201480066271.5 in English.
(Continued)

*Primary Examiner* — Robert Carpenter
(74) *Attorney, Agent, or Firm* — DLA Piper LLP (US)

(57) ABSTRACT

A luminescent material mixture has a first luminescent material and a second luminescent material, wherein, under excitation with blue light, an emission spectrum of the first luminescent material has a relative intensity maximum in a yellowish-green region of the spectrum at a wavelength of greater than or equal to 540 nm and less than or equal to 560 nm and an emission spectrum of the second luminescent material has a relative intensity maximum in an orange-red region of the spectrum at a wavelength of greater than or equal to 600 nm and less than or equal to 620 nm.

16 Claims, 4 Drawing Sheets

(51) Int. Cl.
*H01L 33/50* (2010.01)
*C09K 11/08* (2006.01)
*F21Y 115/10* (2016.01)
*F21W 131/103* (2006.01)

(52) U.S. Cl.
CPC ...... *C09K 11/7728* (2013.01); *C09K 11/7734* (2013.01); *F21S 8/088* (2013.01); *H01L 33/504* (2013.01); *H01L 33/505* (2013.01); *F21W 2131/103* (2013.01); *F21Y 2115/10* (2016.08)

(56) References Cited

U.S. PATENT DOCUMENTS

| | | |
|---|---|---|
| 2011/0220929 A1 | 9/2011 | Collins et al. |
| 2012/0075549 A1 | 3/2012 | Lin et al. |
| 2016/0244665 A1* | 8/2016 | Vosgroene ......... C09K 11/7774 |

FOREIGN PATENT DOCUMENTS

| | | |
|---|---|---|
| DE | 10 2012 019 392 A1 | 6/2013 |
| DE | 10 2012 101 920 A1 | 9/2013 |
| EP | 2 432 037 A1 | 3/2012 |
| EP | 2 604 669 A1 | 6/2013 |
| WO | 2008/065567 A1 | 6/2008 |
| WO | 2011/022399 A1 | 2/2011 |
| WO | 2015/052238 A1 | 4/2015 |

OTHER PUBLICATIONS

Second Office Action dated Oct. 26, 2017, of corresponding Chinese Application No. 20148006271.5, along with an English translation.
Fourth Office Action dated Sep. 28, 2018, of counterpart Chinese Application No. 201480066271.5, along with an English translation.

* cited by examiner

LUMINESCENT-SUBSTANCE MIXTURE, LIGHT-EMITTING SEMICONDUCTOR COMPONENT HAVING A LUMINESCENT-SUBSTANCE MIXTURE, AND STREETLAMP HAVING A LUMINESCENT-SUBSTANCE MIXTURE

TECHNICAL FIELD

This disclosure provides a luminescent material mixture, a light-emitting semiconductor device with a luminescent material mixture and a streetlamp with a luminescent material mixture.

BACKGROUND

Diodes that emit white light are of major significance in general lighting. For outdoor lighting applications, for example, for street lighting, a color rendering index of at least 70 is often required. To provide satisfactory lighting for a wide variety of traffic and road situations, significant flexibility is also desirable with regard to the achievable color temperature, for example, from 3000 K to 6500 K. Since the ambient conditions for street lighting, for instance the ambient temperature, may fluctuate significantly, high color location and brightness stability at varying temperatures is also of major advantage. Furthermore, for use in street lighting a light-emitting diode must exhibit very high aging resistance, in particular with regard to environmental influences such as humidity. At the same time, system efficiency must also be as high as possible, for reasons of energy economy and cost minimization.

It could therefore be helpful to provide a luminescent material mixture that generates light with the highest possible color rendering index over the largest possible temperature range and to provide a light-emitting semiconductor device and a streetlamp with such a luminescent material mixture.

SUMMARY

We provide a luminescent material mixture having a first luminescent material and a second luminescent material, wherein, under excitation with blue light, an emission spectrum of the first luminescent material has a relative intensity maximum in a yellowish-green region of the spectrum at a wavelength of greate than or equal to 540 nm and less than or equal to 560 nm and an emission spectrum of the second luminescent material has a relative intensity maximum in an orange-red region of the spectrum at a wavelength of greater than or equal to 600 nm and less than or equal to 620 nm.

We also provide a light-emitting semiconductor device including a light-emitting semiconductor chip which, when in operation, emits light in a first wavelength range and the luminescent material mixture having a first luminescent material and a second luminescent material, wherein, under excitation with blue light, an emission spectrum of the first luminescent material has a relative intensity maximum in a yellowish-green region of the spectrum at a wavelength of greate than or equal to 540 nm and less than or equal to 560 nm and an emission spectrum of the second luminescent material has a relative intensity maximum in an orange-red region of the spectrum at a wavelength of greater than or equal to 600 nm and less than or equal to 620 nm, that converts at least one part of the light in the first wavelength range emitted by the light-emitting semiconductor chip into light in a second wavelength range different from the first and into light in a third wavelength range different from the first and second.

We further provide a streetlamp including the light-emitting semiconductor device including a light-emitting semiconductor chip which, when in operation, emits light in a first wave-length range and the luminescent material mixture having a first luminescent material and a second luminescent material, wherein, under excitation with blue light, an emission spectrum of the first luminescent material has a relative intensity maximum in a yellowish-green region of the spectrum at a wavelength of greate than or equal to 540 nm and less than or equal to 560 nm and an emission spectrum of the second luminescent material has a relative intensity maximum in an orange-red region of the spectrum at a wavelength of greater than or equal to 600 nm and less than or equal to 620 nm, that converts at least one part of the light in the first wavelength range emitted by the light-emitting semiconductor chip into light in a second wavelength range different from the first and into light in a third wavelength range different from the first and second.

We further yet provide a luminescent material mixture having a first luminescent material and a second luminescent material, wherein under excitation with blue light, an emission spectrum of the first luminescent material has a relative intensity maximum in a yellowish-green region of the spectrum at a wavelength of greater than or equal to 540 nm and less than or equal to 560 nm and an emission spectrum of the second luminescent material has a relative intensity maximum in an orange-red region of the spectrum at a wavelength of greater than or equal to 600 nm and less than or equal to 620 nm, and the second luminescent material is selected from $(Ca,Sr,Eu)AlSiN_3.Si_2N_2O$ or $(Ca,Sr,Ba,Eu)_2Si_5N_8$ with an Eu content of greater than or equal to 1% and less than or equal to 2.5%, with a Ba content of greater than or equal to 45% and less than or equal to 55% and with a Ca content of greater than or equal to 0% and less than or equal to 10%, wherein the Sr content is selected such that the sum of the Eu, Ba, Ca and Sr contents is 100%.

DETAILED DESCRIPTION

Figure 1:
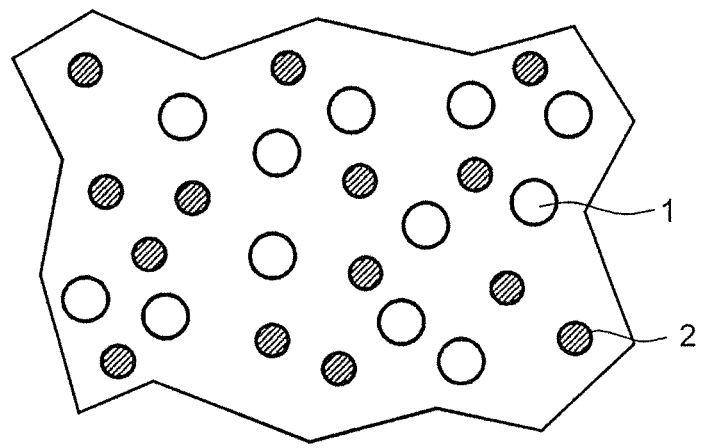
FIG. 1 shows a schematic representation of a luminescent material mixture according to one example.

Our luminescent material mixture may comprise a first luminescent material and a second luminescent material. The first luminescent material has an emission spectrum with a relative intensity maximum in the yellowish-green region of the spectrum. The second luminescent material has an emission spectrum with a relative intensity maximum in the orange-red region of the spectrum. In particular, the first luminescent material may have a relative intensity maximum at a wavelength of greater than or equal to 540 nm and less than or equal to 560 nm and the second luminescent material may have a relative intensity maximum at a wavelength of greater than or equal to 600 nm and less than or equal to 620 nm. The luminescent materials may have an emission spectra with the stated relative intensity maxima in particular under excitation with blue light.

In particular, the luminescent material mixture may generate light with a color location in the CIE standard chromaticity diagram in a white region under excitation with light from the blue region of the spectrum. To this end, the first luminescent material preferably converts one part of the irradiated light in a first wavelength range, in particular blue light, into light in a second wavelength range, in particular into yellowish-green light, while the second luminescent material converts a further part of the irradiated light in the first wavelength range into light in a third wavelength range, in particular into orange-red light. Particularly preferably, one part of the irradiated light in the first wavelength range remains unconverted such that mixed light arises which is preferably composed of blue unconverted light of the first wavelength range and yellowish-green light of the second wavelength range converted by the first luminescent material and orange-red converted light of the third wavelength range.

Particularly preferably, the light generated by the luminescent material mixture under excitation with blue light has a color location with a color temperature of 3000 K to 6500 K. The term "color temperature" may here and hereinafter denote the color temperature of a Planckian black body radiator or indeed the "correlated color temperature" (CCT) known to those skilled in the art in a white light appearance, which is distinguished by color location coordinates that differ from the color location coordinates of the Planckian black body radiator. The color rendering index of the light generated by the luminescent material mixture under excitation with blue light amounts preferably to at least 65 and particularly preferably at least 70. The luminescent material mixture is particularly preferably suited to being stable with regard to operating temperatures of greater than or equal to 85° C.

The first luminescent material may be a garnet luminescent material. In particular, the first luminescent material may be selected from the material system $(Y,Lu,Gd,Ce)_3(Al,Ga)_5O_{12}$. As an alternative designation, garnet luminescent materials that contain Ce may also be written " . . . :Ce," i.e., for example, $(Y,Lu,Gd)_3(Al,Ga)_5O_{12}$:Ce. Particularly preferably, for the first luminescent material a luminescent material selected from the material systems $(Y,Lu,Ce)_3Al_5O_{12}$ and $(Y,Lu,Ce)_3(Al,Ga)_5O_{12}$ is used. The material systems indicated here and hereinafter for the first and second luminescent material should not be understood as strictly mathematical with regard to the empirical formulas. Instead, the first and second luminescent materials are still covered by the stated empirical formulas if additional materials, for example, impurities, are contained therein in small proportions. In garnet luminescent materials, it is, for example, possible to replace a small proportion of the oxygen with materials such as for instance N, F, Cl, Br.

According to a further example, the first luminescent material is selected from the material system $(Y,Lu,Ce)_3Al_5O_{12}$ with a Ce content of greater than or equal to 0.5% and less than or equal to 5% and a Y content of greater than or equal to 0% and less than or equal to 20%. Particularly preferably, the Ce content may be greater than or equal to 1% and less than or equal to 3%. The Y content may particularly preferably be greater than or equal to 5% and less than or equal to 20%. Unless otherwise stated, the percentages stated in relation to luminescent material compositions denote mol %. Moreover, one part of the Al may also be substituted with Ga. Particularly preferably, the first luminescent material with the stated composition has an emission region with an intensity maximum of greater than or equal to 540 nm and less than or equal to 560 nm.

The second luminescent material may be a nitridosilicate luminescent material. In particular, the second luminescent material may be selected from the material systems $(Ca,Sr,Ba,Eu)_2Si_5N_8$, $(Ca,Sr,Eu)AlSiN_3.Si_2N_2O$ and $(Ca,Sr,Eu)AlSiN_3$. As an alternative designation, nitridosilicate luminescent materials that contain Eu may also be written " . . . :Eu," i.e., for example, $(Ca,Sr,Ba)_2Si_5N_8$:Eu. Furthermore, the second luminescent material may be selected from a material system described in DE 10 2013 222 144.4, the subject matter of which is incorporated herein in its entirety by reference. The second luminescent material particularly preferably has a peak emission wavelength, i.e., a relative intensity maximum, at a wavelength of greater than or equal to 600 nm and less than or equal to 620 nm and particularly preferably greater than or equal to 605 nm and less than or equal to 615 nm. As already described above, the second luminescent material, like the first luminescent material, may then also continue to fall under the stated material systems if it comprises additional materials, for example, impurities in small proportions. Such additional materials may, for example, be F, Cl, Br, C, O, B, Al.

The second luminescent material may be selected from the material system $(Ca,Sr,Ba,Eu)_2Si_5N_8$ with an Eu content of greater than or equal to 0.5% and less than or equal to 4%, with a Ba content of greater than or equal to 30% and less than or equal to 70% and with a Ca content of greater than or equal to 0% and less than or equal to 20%. In this case, the Sr content is selected such that the sum of the alkaline earth metals and europium, i.e., the sum of the Eu, Ba, Ca and Sr contents, is 100%. Preferably, the second luminescent material is selected such that the Eu content is greater than or equal to 1% and less than or equal to 2.5% and/or the Ba content is greater than or equal to 45% and less than or equal to 55% and/or the Ca content is greater than or equal to 0% and less than or equal to 10%. In addition to having a high conversion efficiency, emission temperature stability and chemical resistance, such a second luminescent material may be distinguished by very high stability in terms of radiation, high temperatures, humidity and combinations thereof.

The second luminescent material may be selected from the material system $(Ca,Sr,Eu)AlSiN_3.Si_2N_2O$ with an Eu content of greater than or equal to 0.1% and less than or equal to 2% and with an Sr content of greater than or equal to 60% and less than or equal to 100%. In this case, the Ca content is selected such that the sum of the Eu, Sr and Ca contents is 100%. Preferably, the second luminescent material is selected such that the Eu content is greater than or equal to 0.3% and less than or equal to 1% and/or the Sr content is greater than or equal to 80% and less than or equal to 100%.

Particularly preferably, the excitation spectrum of the first and/or second luminescent material has a relative maximum in the blue region of the spectrum at a wavelength of greater than or equal to 440 nm and less than or equal to 460 nm and preferably of greater than or equal to 445 nm and less than or equal to 455 nm.

The luminescent material mixture may be formed, for example, from luminescent material particles. This means that the first luminescent material and/or the second luminescent material is/are present in the form of particles in the luminescent material mixture, wherein a plurality of first particles comprise the first luminescent material or are formed from the first luminescent material and a plurality of second particles comprise the second luminescent material or are formed from the second luminescent material.

The particles of the first luminescent material and/or the particles of the second luminescent material preferably have an average grain size of 5 μm to 50 μm and particularly preferably of 10 μm to 30 μm.

The particles of the luminescent materials may moreover have a coating. For a second luminescent material selected from the material system (Ca,Sr,Eu)AlSiN$_3$.Si$_2$N$_2$O in particular, a coating with an inert material, for example, SiO$_2$ and/or Al$_2$O$_3$, is advantageous to stabilize the luminescent material since the host structure displays an intrinsic instability with regard to humidity that may lead to rapid degradation under conditions of high atmospheric humidity.

Furthermore, it is also possible for the luminescent material mixture to be formed from different layers, wherein a first layer comprises the first luminescent material or is formed from the first luminescent material and a second layer comprises the second luminescent material or is formed from the second luminescent material.

In addition to the advantages described above, the luminescent materials have the further advantage that they have particularly slight quenching behavior under thermal load, i.e., a lower reduction in conversion efficiency at high temperatures than other luminescent materials. Furthermore, the luminescent materials described here also display high resistance to radiation and humidity.

The luminescent material mixture is particularly preferably free of a further wavelength-converting material. In other words, wavelength conversion proceeds in the luminescent material mixture proposed here particularly preferably merely by the first luminescent material and the second luminescent material. Wavelength conversion is understood to mean that the luminescent material absorbs irradiated light of a given wavelength range, converts this radiation into radiation of a different wavelength range and emits it again. In particular, mere scattering, absorption or reflection without conversion into radiation of a different wavelength is not here understood as wavelength conversion.

The first luminescent material may exhibit a ratio to the second luminescent material, with regard to weight, of less than or equal to 100:1 or 60:1 or 40:1 and greater than or equal 2:1 or 1:1 or 0.5:1.

In particular, the luminescent material mixture according to the above-described examples is suitable for use in conjunction with a light-emitting semiconductor chip in a light-emitting semiconductor device. When in operation, the light-emitting semiconductor chip particularly preferably emits light in a first wavelength range and the described luminescent material mixture converts at least one part of the radiation emitted by the light-emitting semiconductor chip into light of the second and third wavelength ranges, wherein the first, second and third wavelength ranges differ from one another. The fact that the first, second and third wavelength ranges differ from one another may in particular mean that the wavelength ranges have different intensity maxima from one another. Furthermore, however, the different wavelength ranges also partly overlap. The first wavelength range is preferably the emission spectrum of the light-emitting semiconductor chip. The second wavelength range is preferably the emission spectrum of the first luminescent material. The third wavelength range is preferably the emission spectrum of the second luminescent material.

The light-emitting semiconductor chip is here provided to excite the luminescent material mixture to wavelength conversion. The light-emitting semiconductor chip therefore particularly preferably emits from a light outlet face light in the first wavelength range from the blue region of the spectrum. Particularly preferably, the light-emitting semiconductor chip emits light adapted to the excitation spectrum of the first luminescent material and/or of the second luminescent material. Particularly preferably, the emission spectrum of the light-emitting semiconductor chip comprises at least a relative or an absolute maximum that differs from a relative or an absolute maximum of the excitation spectrum of the first luminescent material by no more than 20 nm and preferably by no more than 10 nm.

The first wavelength range, i.e., the emission spectrum of the light-emitting semiconductor chip, may have a dominant wavelength of greater than or equal to 440 nm and less than or equal to 460 nm and preferably greater than or equal to 445 nm and less than or equal to 455 nm. The dominant wavelength should here in particular not be equated to a peak wavelength. The dominant wavelength corresponds to the value of the point of intersection of the contour line of the CIE diagram, i.e., the spectrum locus in the CIE diagram, with the connecting line between the color location of the stated light and the achromatic point with the color location coordinates cx=cy=⅓.

In the case, in particular, of the luminescent material mixture having luminescent material particles as described above, according to one example these are introduced into a resin, preferably a silicone or epoxide. The resin with the luminescent material particles is, for example, arranged in the form of a wavelength conversion layer on the light-emitting semiconductor chip. Furthermore, it is also possible for the resin with the luminescent material particles to be arranged in the form of volume potting over the light-emitting semiconductor chip. The light-emitting semiconductor chip is preferably arranged in a recess in a device package into which the potting compound is fed such that the light-emitting semiconductor chip is encapsulated by the potting compound.

Furthermore, the luminescent material mixture may be arranged in any other way within the light-emitting semiconductor device such that a desired part of the primary light emitted by the light-emitting semiconductor chip in the first wavelength range passes through the luminescent material mixture or impinges on the luminescent material mixture and is converted thereby.

Particularly preferably, the light-emitting semiconductor device emits polychromatic light composed of light of the first wavelength range and light of the two further wavelength ranges and has a color location in the white region of the CIE standard chromaticity diagram. Particularly preferably, the light emitted by the light-emitting semiconductor device has a color rendering index of greater than or equal to 65 and particularly preferably of greater than or equal to 70 at a color temperature of greater than or equal to 3000 K and less than or equal to 6500 K.

The luminescent material mixture is in particular comparatively temperature-stable. It is therefore particularly well suited to use in a streetlamp comprising as a light source at least one light-emitting semiconductor device according to the above-described examples with at least one light-emitting semiconductor chip and the luminescent material mixture.

The above-described features and examples apply equally to the luminescent material mixture, the light-emitting semiconductor device with the luminescent material mixture and the streetlamp with the light-emitting semiconductor device.

In particular, when used in the light-emitting semiconductor device, the luminescent material mixture displays a high color rendering index of greater than or equal to 65 and particularly preferably of greater than or equal to 70 over a very wide color temperature range. The minimum color rendering index of 65 and preferably of 70 is achieved even with very efficient shortwave light-emitting semiconductor chips through selection of the two luminescent materials. Due to the possibility of using a wide wavelength range for light-emitting semiconductor chips, production yield may additionally be increased. Furthermore, the luminescent material mixture additionally displays greater conversion efficiency than known materials at the same time as high resistance to radiation, temperature and humidity.

Further advantages and developments are revealed by the examples described below in connection with the figures.

Identical, similar or identically acting elements are provided with the same reference numerals in the figures. The figures and the size ratios of the elements illustrated in the figures relative to one another are not to be regarded as being to scale. Rather, individual elements, in particular layer thicknesses, may be illustrated on an exaggeratedly large scale for greater ease of depiction and/or better comprehension.

FIG. 1 shows an example of a luminescent material mixture having a first luminescent material 1 and a second luminescent material 2, wherein, under excitation with light in a first wavelength range, the first luminescent material 1 emits light in a second wavelength range different from the first wavelength range and the second luminescent material 2 emits light in a third wavelength range different from the first and second wavelength ranges. The fact that the first, second and third wavelength ranges differ from one another may in particular mean that the wavelength ranges have different intensity maxima from one another. Furthermore, however, the different wavelength ranges also partly overlap. Under excitation with blue light in particular, the first luminescent material 1 may emit greenish-yellow light and the second luminescent material 2 orange-red light.

Particularly preferably, the excitation spectrum of the first and/or second luminescent material 1, 2 has a relative maximum in the blue region of the spectrum at a wavelength of greater than or equal to 440 nm and less than or equal to 460 nm and preferably of greater than or equal to 445 nm and less than or equal to 455 nm.

The composition of the first luminescent material 1 is matched to the wavelength range of the exciting light and the emission spectrum of the second luminescent material 2 to achieve high system efficiency and temperature stability of the overall system. In this case, the first luminescent material 1 in particular is selected such that under excitation with blue light, in particular light in a wavelength range of greater than or equal to 440 nm and less than or equal to 460 nm, the emission peak of the first luminescent material 1 is greater than or equal to 540 nm and less than or equal to 560 nm, while the emission peak of the second luminescent material 2 is greater than or equal to 600 and less than or equal to 620 nm and particularly preferably is greater than or equal to 605 nm and less than or equal to 615 nm.

A yellowish-green-emitting garnet luminescent material, in particular from the material system $(Y,Lu,Gd,Ce)_3(Al,Ga)_5O_{12}$, is provided as first luminescent material 1. Particularly preferably, a luminescent material from the material systems $(Y,Lu,Ce)_3Al_5O_{12}$ and $(Y,Lu,Ce)_3(AL,Ga)_5O_{12}$ with a maximum excitability of 440 nm to 455 nm, preferably of 445 nm to 455 nm, is particularly preferably used for the first luminescent material 1. These above-described properties of the first luminescent material 1 are preferably achieved by a luminescent material from the material system $(Y,Lu,Ce)_3Al_5O_{12}$ with a Ce content of 0.5% to 5% inclusive and preferably of 1% to 3%, and with a Y content of 0 to 20% and preferably of 5 to 20%. Furthermore, other element combinations are also possible, which lead to similar spectral properties, in particular also above-stated luminescent materials in which one part of the Al is substituted with Ga.

The second luminescent material 2 is selected such that, in combination with the exciting light and the emission spectrum of the first luminescent material 1, a color rendering index of greater than or equal to 65 and preferably of greater than or equal to 70 over the widest possible color temperature range is achieved. In particular, the color temperature range extends over 3000 K to 6500 K. Furthermore, the composition of the second luminescent material 2 is selected such that high stability with regard to the influence of radiation, temperature and humidity is achieved.

Preferably, the second luminescent material 2 comprises one or more nitridosilicate luminescent materials from the material systems $(Ca,Sr,Ba,Eu)_2Si_5N_8$, $(Ca,Sr,Eu)AlSiN_3.Si_2N_2O$ and $(Ca,Sr,Eu)AlSiN_3$ with a peak emission wavelength of 600 nm to 620 nm and particularly preferably 605 nm to 615 nm.

Preferably, these spectral properties are achieved with a second luminescent material 2 from the material system $(Ca,Sr,Ba,Eu)_2Si_5N_8$ with an Eu content of greater than or equal to 0.5% and less than or equal to 4%, with a Ba content of greater than or equal to 30% and less than or equal to 70% and with a Ca content of greater than or equal to 0% and less than or equal to 20%. In this case, the Sr content is selected such that the sum of the alkaline earth metals and europium, i.e., the sum of the Eu, Ba, Ca and Sr contents, is 100%. Preferably, the second luminescent material 2 is selected such that the Eu content is greater than or equal to 1% and less than or equal to 2.5%, the Ba content is greater than or equal to 45% and less than or equal to 55% and the Ca content is greater than or equal to 0% and less than or equal to 10%. In addition to high conversion efficiency, temperature stability of the emission and chemical resistance, these luminescent materials particularly preferred for the second luminescent material 2 are also distinguished by very high stability with regard to radiation, high temperatures, humidity and combinations thereof.

Alternatively or in addition, the second luminescent material 2 may comprise $(Ca,Sr,Eu)AlSiN_3.Si_2N_2O$ with an Eu content of greater than or equal to 0.1% and less than or equal to 2% and with an Sr content of greater than or equal to 60% and less than or equal to 100%. In this case, the Ca content is selected such that the sum of the Eu, Sr and Ca contents is 100%. The second luminescent material 2 is preferably selected such that the Eu content is greater than or equal to 0.3% and less than or equal to 1% and the Sr content is greater than or equal to 80% and less than or equal to 100%. Since the host structure of this material system has an intrinsic instability with regard to humidity, it is advantageous to provide particles of this luminescent material with a coating or encapsulation of an inert material, for example, $SiO_2$ and/or $Al_2O_3$. In this way, it is possible to prevent degradation of the luminescence properties, for example, in applications with light-emitting diodes from occurring, for example, under conditions of high atmospheric humidity.

The first and second luminescent materials 1, 2 may in particular be present in the luminescent material mixture in the form of particles. In the example shown, the first luminescent material 1 is present in a ratio, relative to weight, with the second luminescent material 2 preferably of less than or equal to 100:1 or less than or equal to 60:1 or less than or equal to 40:1 and greater than or equal to 2:1 or greater than or equal to 1:1 or greater than or equal to 0.5:1.

Figure 2:
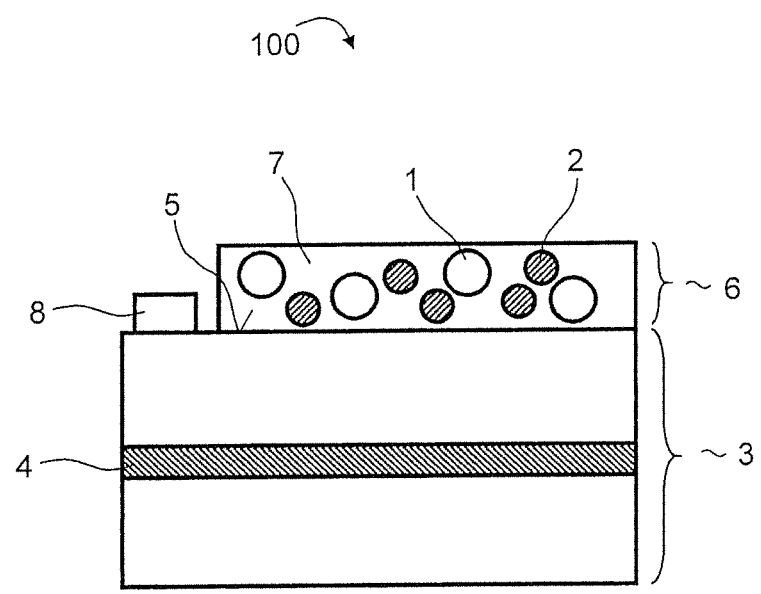
FIG. 2 shows a light-emitting semiconductor device according to a first example.

FIG. 2 shows an example of a light-emitting semiconductor device 100 with a light-emitting semiconductor chip 3 and an above-described luminescent material mixture.

The light-emitting semiconductor chip 3 takes the form of a light-emitting diode and has an active region 4 that generates light emitted via a light outlet face 5. The light-emitting semiconductor chip 3 in particular emits light of a first wavelength range from its light outlet face 5, wherein the first wavelength range encompasses blue radiation, in particular with a dominant wavelength of greater than or equal to 440 nm and less than or equal to 460 nm and particularly preferably of greater than or equal to 445 nm and less than or equal to 455 nm.

On the light outlet face 5 of the light-emitting semiconductor chip 3, the light-emitting semiconductor device 100 comprises a wavelength conversion layer 6. The wavelength conversion layer 6 comprises a resin 7 into which a luminescent material mixture has been introduced as has already been described, for example, with reference to FIG. 1.

The particles of the first luminescent material 1 convert the blue light of the first wavelength range emitted from the light outlet face 5 of the light-emitting semiconductor chip 3 into yellowish-green light of a second wavelength range. Furthermore, the particles of the second luminescent material 2 convert blue light of the first wavelength range generated by the active region 4 into orange-red light of a third wavelength range. The wavelength conversion layer 6 is configured such that polychromatic radiation arises with a color location in the white region of the CIE standard chromaticity diagram.

Furthermore, in the example illustrated, to the side of the wavelength conversion layer 6 a bond pad 8 is applied, which is provided for electrical contacting of the light-emitting semiconductor chip 3. The structure of the light-emitting semiconductor chip 3 should be understood purely as an example. Unlike in the example shown, the light-emitting semiconductor chip 3 may also have additional or alternative features of light-emitting semiconductor chips known to those skilled in the art and will therefore not be explained in further detail.

In the light-emitting semiconductor device, a spectrally controlled yellowish-green first luminescent material and a spectrally controlled orange-red second luminescent material are combined with a suitable blue-emitting light-emitting semiconductor chip to yield an overall system more flexible than known systems. The emission and optimum excitability of the first luminescent material are shifted to shorter wavelengths than conventionally yellow luminescent materials in known solutions, whereby a higher blue-green proportion in the resultant overall spectrum may be achieved to increase color rendering in particular at high color temperatures and/or when shortwave blue-emitting semiconductor chips are used. The second luminescent material is selected such that a minimum color rendering index of 65 and preferably of 70 may be ensured even for low color temperatures. The overall system is controlled such that, in a color temperature of 3000 K to 6500 K, even when shortwave blue-emitting semiconductor chips are used, for example, with a dominant wavelength of less than or equal to 446 nm, a high color rendering index of greater than or equal to 65 and preferably of greater than or equal to 70 is achieved. Notwithstanding its markedly improved color rendering and flexibility, the luminescent material mixture at the same time also displays increased conversion efficiency compared to known solutions.

FIGS. 3 to 7 show characteristics of exemplary luminescent materials and luminescent material mixtures compared to conventional materials.

Figure 3:
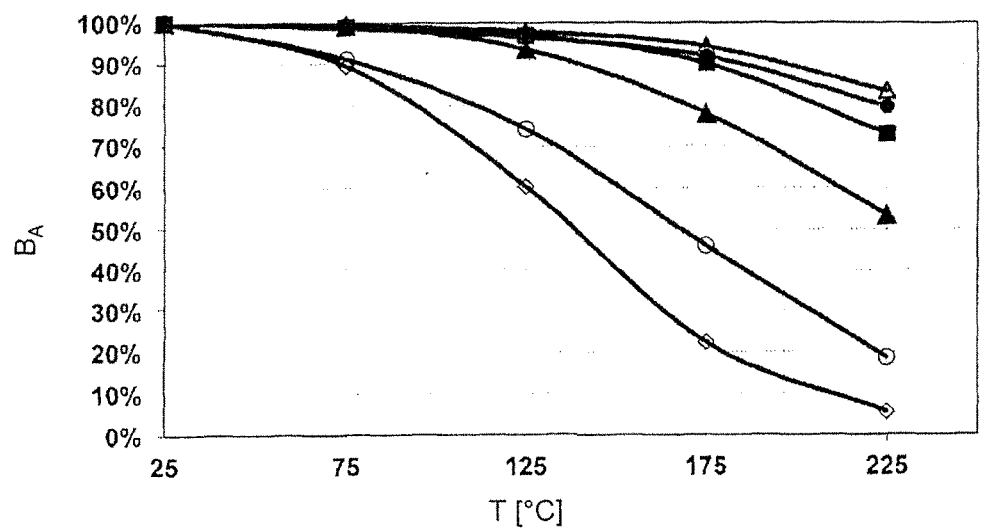
FIGS. 3 to 7 show properties of luminescent materials and luminescent material mixtures according to further examples.

In FIG. 3, "thermal quenching" of nitridosilicate luminescent materials for the second luminescent material is shown compared to other orange- or red-converting luminescent materials. To this end, on the horizontal axis the temperature is plotted in ° C. and on the vertical axis the absolute brightness $B_A$, relative to the brightness at a temperature of 25° C. The luminescent materials considered were those of the composition $(Ca,Sr,Ba,Eu)_2Si_5N_8$ with a Ba content of greater than or equal to 45% and less than or equal to 55% and with a Ca content of greater than or equal to 0% and less than or equal to 10%. In particular, FIG. 3 shows $(Sr,Ba)_2Si_5N_8$:Eu with a Ba content of 50% (empty triangles), $(Sr,Ba,Ca)_2Si_5N_8$:Eu with a Ba content of 50% and a Ca content of 2.5% (filled circles), $(Sr,Ba,Ca)_2Si_5N_8$:Eu with a Ba content of 50% and a Ca content of 10% (filled squares), $(Sr,Ba)_2Si_5N_8$:Eu with a Ba content of 75% (filled triangles), $Ca_2Si_5N_8$:Eu (empty circles) and $(Sr,Ba,Ca)_2SiO_4$:Eu (empty rhombuses). It is clear that, in particular for a Ba content of 50% and a Ca content of 0% or 2.5%, very low thermal quenching may be achieved for the second luminescent material.

Figure 4:
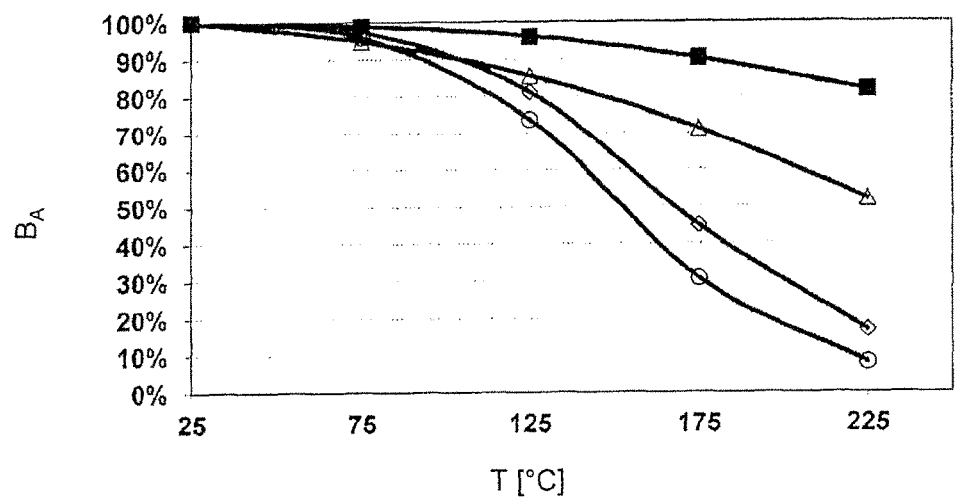

FIG. 4 shows thermal quenching of garnet luminescent materials for the first luminescent material compared to other yellow-green luminescent materials. The axes are labeled in the same way as in FIG. 3. It is clear that in particular the composition $(Y,Lu)_3Al_5O_{12}$:Ce with a Y content of greater than or equal to 0% and less than or equal to 20% (filled squares) leads to very low thermal quenching. The other curves represent $Y_3(Al,Ga)_5O_{12}$:Ce (empty triangles) and two compositions of $(Sr_{1-x},Ba_x)_2SiO_4$:Eu (empty rhombuses and empty circles).

Figure 5:
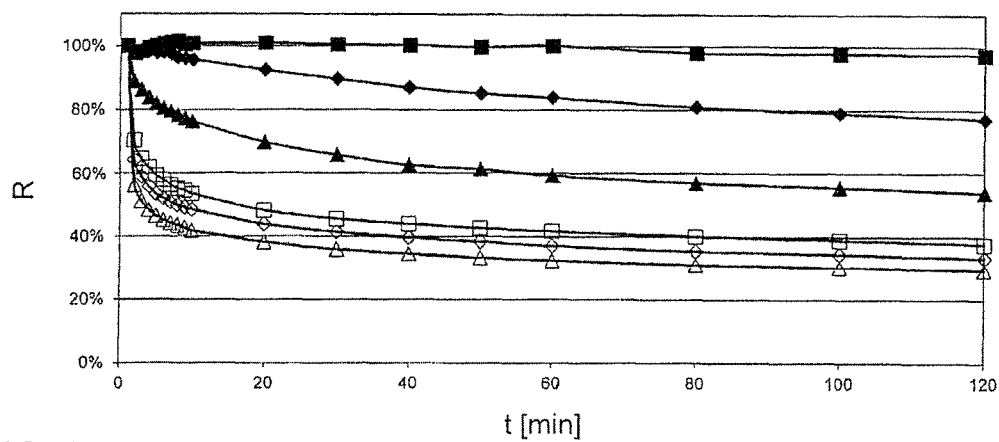

FIG. 5 shows a laser accelerated aging test with which the aging resistance of the luminescent material system $(Ca,Sr,Ba)_2Si_5N_8$:Eu with a Ca content of 10% and variable Ba content (filled square: 50% Ba; filled rhombuses: 40% Ba; filled triangles: 30% Ba; empty squares: 20% Ba; empty rhombuses: 10% Ba; empty triangles: 0% Ba) was determined. The samples were exposed to intensive blue laser radiation. At the same time, the red and blue peak ratio, i.e., the conversion ratio of the resultant spectrum was determined in a time-resolved manner. FIG. 5 shows time dependency of the degree of conversion R, normalized to the value at the start of measurement, over time t in minutes. The closer the measured value remains to 100%, the more stable the luminescent material. The data show a significant influence of the Ba content of the host structure on the stability of the luminescent material. From a Ba content of around 50%, there is no longer any measurable degradation within the bounds of measurement error, a Ba content of around 50% thus proving particularly advantageous.

Figure 6:
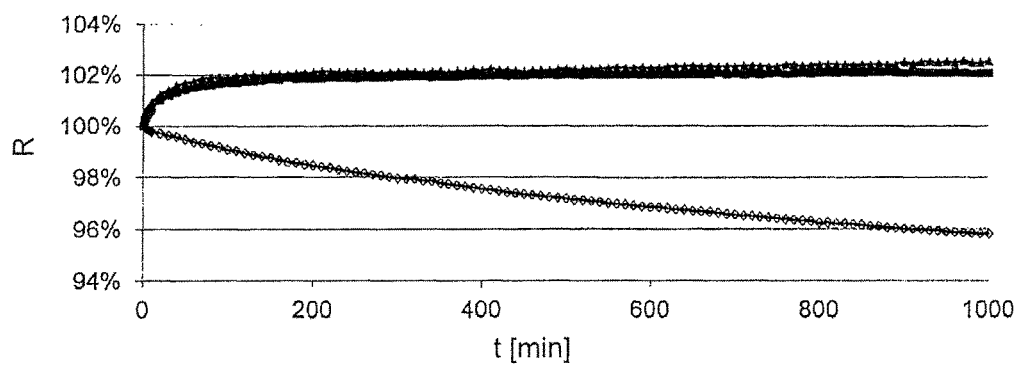

FIG. 6 shows a further aging test to determine the aging resistance of the luminescent material system $(Ca,Sr,Ba)_2Si_5N_8$:Eu with variable Ba and Ca content (filled triangles: 50% Ba, 2.5% Ca; filled squares: 50% Ba, 0% Ca; empty rhombuses: 20% Ba, 0% Ca), wherein, compared to the measurement of FIG. 5, light-emitting semiconductor chips embodied as blue-emitting light-emitting diodes and with a dominant wavelength of 440 nm were used as the blue light source instead of a laser. The blue-emitting semiconductor chips were potted with a silicone-luminescent material dispersion and then operated at elevated ambient temperature, in particular at a temperature of 85° C. measurable at the soldering point, for a total of 1000 minutes at a forward current of 500 mA. The red and blue peak ratio, i.e., the conversion ratio of the resultant spectrum, was determined in a time-resolved manner. The axes are labeled in the same way as in FIG. 5, time dependency of the degree of conversion R, normalized to the value at the start of measurement, again being plotted. Like the measurement already shown in FIG. 5, the data shown in FIG. 6 also show that the Ba content of the host structure has a significant influence on the stability of the luminescent material. In the two samples with a Ba content of around 50% and a Ca content of 0 and 2.5%, there is no longer any measurable degradation within the bounds of measurement error, a Ba content of around 50% thus proving particularly advantageous.

Figure 7:
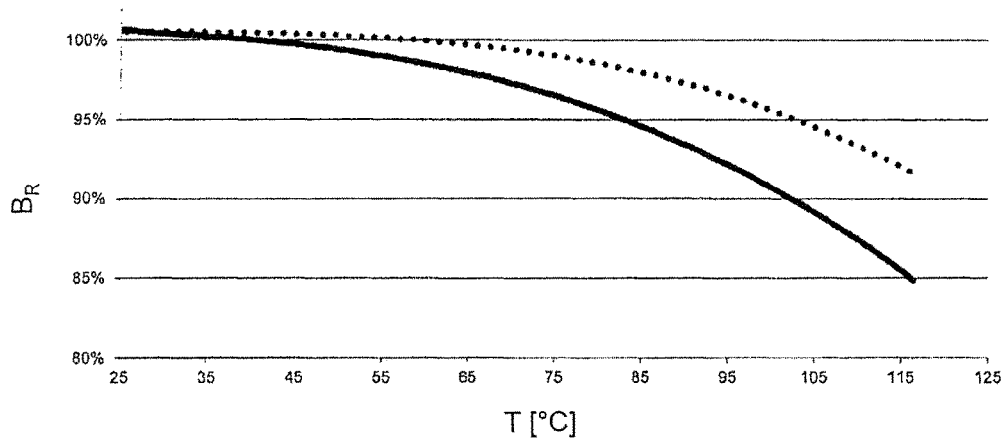

FIG. 7 shows the relative brightness $B_R$ curve, dependent on the temperature T in ° C., of two white-emitting semiconductor devices with a color rendering index of 70 and a correlated color temperature of around 5000 K. The two semiconductor devices have a light-emitting semiconductor chip with a dominant wavelength of 445 nm. The dotted line shows the measurement with a semiconductor device described here having a luminescent material mixture with $(Y,Lu)_3Al_5O_{12}$:Ce (10% Y, 3% Ce) as first luminescent material and with $(Ca,Sr,Ba)_2Si_5N_8$:Eu (2.5% Ca, 50% Ba, 2% Eu) as second luminescent material. The continuous line shows the measurement with a known light-emitting diode having a combination of $Y_3(Al,Ga)_5O_{12}$:Ce (25% Ga, 4% Ce) and $(Sr,Ba)_2Si_5N_8$:Eu (50% Ba, 4% Eu). While the known light-emitting diode loses around 16% of its brightness at a temperature T of 116° C. relative to operation at room temperature, the brightness of a semiconductor device with our luminescent material mixture decreases only by around 9%.

In addition to the described measurements, further tests were carried out in which our luminescent material mixtures were compared to known luminescent material combinations.

In addition to the luminescent material mixtures and in conjunction with the examples and in the general part in combination with blue-emitting semiconductor chips, the following luminescent material mixtures in particular have proven particularly advantageous, wherein, in each case, the dominant wavelength of the first luminescent material, the total concentration, the green-red-ratio, the color location coordinates cx and cy, the correlated color temperature CCT in K and the color rendering index CRI are additionally stated:

1. Dominant wavelength of the semiconductor chip: 450 nm; first luminescent material: $(Y,Lu)_3Al_5O_{12}$:Ce (5% Y, 3% Ce); second luminescent material: $(Sr,Ba)_2Si_5N_8$:Eu (50% Ba, 4% Eu); dominant wavelength of the first luminescent material: 566.6 nm; total concentration: 17.1%;
   green-red ratio: 30.0:1;
   cx: 0.338; cy: 0.370;
   CCT: 5310 K;
   CRI: 70
2. Dominant wavelength of the semiconductor chip: 444.5 nm; first luminescent material: $(Y,Lu)_3Al_5O_{12}$:Ce (15% Y, 2% Ce); second luminescent material: $(Ca,Sr,Ba)_2Si_5N_8$:Eu (50% Ba, 0% Ca, 1% Eu);
   dominant wavelength of the first luminescent material: 565.2 nm;
   total concentration: 20.3%;
   green-red ratio: 3.2:1; cx: 0.433; cy: 0.406;
   CCT: 3075 K;
   CRI: 68
3. Dominant wavelength of the semiconductor chip: 444.4 nm; first luminescent material: $(Y,Lu)_3Al_5O_{12}$:Ce (15% Y, 2% Ce); second luminescent material: $(Ca,Sr,Ba)_2Si_5N_8$:Eu (50% Ba, 2.5% Ca, 1% Eu);
   dominant wavelength of the first luminescent material: 565.2 nm;
   total concentration: 19.5%;
   green-red ratio: 3.25:1;
   cx: 0.432; cy: 0.404;
   CCT: 3079 K;
   CRI: 69
4. Dominant wavelength of the semiconductor chip: 444.5 nm; first luminescent material: $(Y,Lu)_3Al_5O_{12}$:Ce (15% Y, 2% Ce); second luminescent material: $(Ca,Sr,Ba)_2Si_5N_8$:Eu (50% Ba, 0% Ca, 1.5% Eu);
   dominant wavelength of the first luminescent material: 565.2 nm;
   total concentration:18.5%;
   green-red ratio: 4.5:1; cx: 0.432; cy: 0.403;
   CCT: 3072 K;
   CRI: 70
5. Dominant wavelength of the semiconductor chip: 444.5 nm; first luminescent material: $(Y,Lu)_3Al_5O_{12}$:Ce (15% Y, 2% Ce); second luminescent material: $(Ca,Sr,Ba)_2Si_5N_8$:Eu (50% Ba, 0% Ca, 1% Eu);
   dominant wavelength of the first luminescent material: 565.2 nm;
   total concentration: 16.5%;
   green-red ratio:8.3:1;
   cx: 0.345;
   cy: 0.354;
   CCT: 5029 K;
   CRI: 70
6. Dominant wavelength of the semiconductor chip: 444.4 nm; first luminescent material: $(Y,Lu)_3Al_5O_{12}$:Ce (15% Y, 2% Ce); second luminescent material: $(Ca,Sr,Ba)_2Si_5N_8$:Eu (50% Ba, 0% Ca, 1% Eu);
   dominant wavelength of the first luminescent material: 565.2 nm;
   total concentration: 13.7%;
   green-red ratio: 14.0:1;
   cx: 0.314: cy: 0.329;
   CCT: 6450 K;
   CRI: 69

In known luminescent material combinations it was established that, when the first luminescent material varies such that the emission thereof is shifted to increasingly shorter wavelengths, the color rendering index increases constantly and the relative efficiency and the green-red ratio decrease constantly.

Example 1 for a luminescent material mixture that generates mixed light with a color rendering index of around 70 and a correlated color temperature of around 5000 K, however, displays a greater relative efficiency than the reference luminescent material combination even when emission of the first luminescent material is shifted towards shorter wavelengths. The same effect may also be noted in Examples 2 to 4 for luminescent material mixtures provided to generate mixed light with a color rendering index of around 70 and a correlated color temperature of around 3000 K, as well as in Example 5, whose luminescent material mixture is provided to generate mixed light with a color rendering index of around 70 and a correlated color temperature of around 5000 K and, in Example 6, whose luminescent material mixture generates mixed light with a color rendering index of around 70 and a correlated color temperature of around 6500 K. It is was thus inter alia possible in particular to establish that the above-stated luminescent material mixtures display a significantly increased relative efficiency compared to a respective known reference luminescent material mixture.

Figure 8:
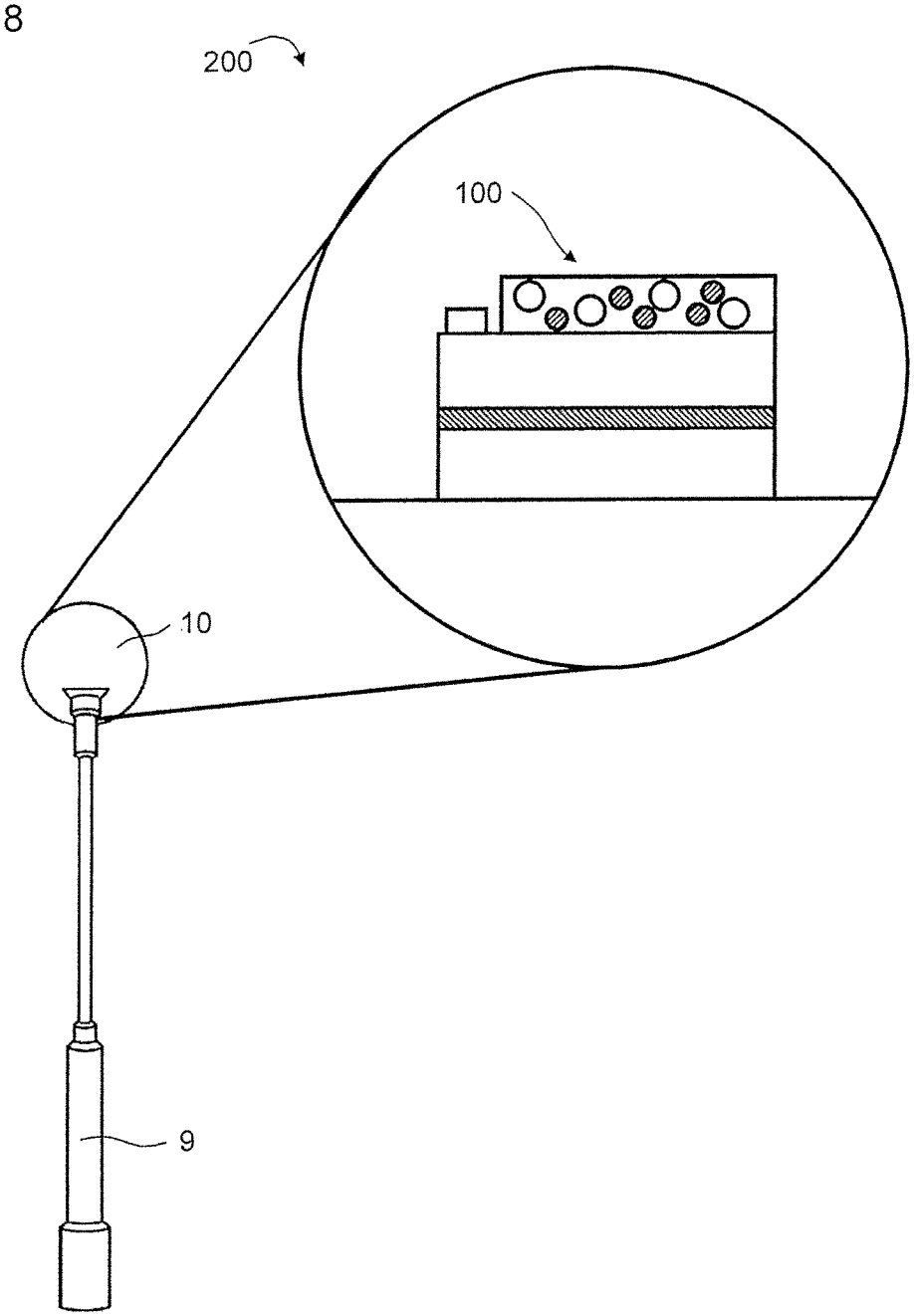
FIG. 8 shows a schematic representation of a streetlamp according to one example.

FIG. 8 shows an example of a streetlamp 200. The streetlamp 200 comprises a lamppost 9 and a lantern 10 surrounding the light source. A light-emitting semiconductor device 100 as described, for example, above in conjunction with FIG. 2 is used as the light source.

The examples and features described in conjunction with the figures may be combined together. Furthermore, the examples shown in the figures may alternatively or additionally comprise further features according to the description in the general part.

The description made with reference to the examples does not restrict this disclosure to these examples. Rather, the disclosure encompasses any novel feature and any combination of features, including in particular any combination of features in the appended claims, even if the feature or combination is not itself explicitly indicated in the claims or examples.

This application claims priority of DE 10 2013 113 382.7, the subject matter of which is incorporated herein by reference.

The invention claimed is:

1. A luminescent material mixture having a first luminescent material and a second luminescent material,
    wherein under excitation with blue light, an emission spectrum of the first luminescent material has a relative intensity maximum in a yellowish-green region of the spectrum at a wavelength of greater than or equal to 540 nm and less than or equal to 560 nm and an emission spectrum of the second luminescent material has a relative intensity maximum in an orange-red region of the spectrum at a wavelength of greater than or equal to 600 nm and less than or equal to 620 nm, and
    the second luminescent material is selected from $(Ca,Sr,Eu)AlSiN_3 \cdot Si_2N_2O$ or $(Ca,Sr,Ba,Eu)_2Si_5N_8$ with an Eu content of greater than or equal to 1% and less than or equal to 2.5%, with a Ba content of greater than or equal to 45% and less than or equal to 55% and with a Ca content of greater than or equal to 0% and less than or equal to 10%, wherein the Sr content is selected such that the sum of the Eu, Ba, Ca and Sr contents is 100%.

2. The luminescent material mixture according to claim 1, wherein the first luminescent material is $(Y,Lu,Ce)_3Al_5O_{12}$ and $(Y,Lu,Ce)_3(Al,Ga)_5O_{12}$ and has a maximum excitability at a wavelength of greater than or equal to 445 nm and less than or equal to 455 nm.

3. The luminescent material mixture according to claim 1, wherein the first luminescent material is a garnet luminescent material.

4. The luminescent material mixture according to claim 1, wherein the first luminescent material has a relative intensity maximum at a wavelength of greater than or equal to 545 nm and less than or equal to 555 nm.

5. The luminescent material mixture according to claim 1, wherein the first luminescent material is $(Y,Lu,Gd,Ce)_3(Al,Ga)_5O_{12}$.

6. The luminescent material mixture according to claim 1, wherein the first luminescent material is $(Y,Lu,Ce)_3Al_5O_{12}$ and $(Y,Lu,Ce)_3(Al,Ga)_5O_{12}$ and has a maximum excitability at a wavelength of greater than or equal to 440 nm and less than or equal to 460 nm.

7. The luminescent material mixture according to claim 1, wherein the first luminescent material is $(Y,Lu,Ce)_3Al_5O_{12}$ with a Ce content of greater than or equal to 0.5% and less than or equal to 5% and a Y content of greater than or equal to 0% and less than or equal to 20%.

8. The luminescent material mixture according to claim 7, wherein the Ce content is greater than or equal to 1% and less than or equal to 3% and the Y content is greater than or equal to 5% and less than or equal to 20%.

9. The luminescent material mixture according to claim 1, wherein the second luminescent material has a relative intensity maximum at a wavelength of greater than or equal to 605 nm and less than or equal to 615 nm.

10. The luminescent material mixture according to claim 1, wherein the first and second luminescent materials are particles.

11. The luminescent material mixture according to claim 1, wherein the second luminescent material is $(Ca,Sr,Eu)AlSiN_3 \cdot Si_2N_2O$ and takes the form of particles with an inert coating selected from $SiO_2$ and $Al_2O_3$.

12. A light-emitting semiconductor device comprising a light-emitting semiconductor chip which, when in operation, emits light in a first wavelength range and the luminescent material mixture according to claim 1, that converts at least one part of the light in the first wavelength range emitted by the light-emitting semiconductor chip into light in a second wavelength range different from the first and into light in a third wavelength range different from the first and second.

13. The light-emitting semiconductor device according to claim 12, wherein the first wavelength range has a dominant wavelength of greater than or equal to 440 nm and less than or equal to 460 nm.

14. The light-emitting semiconductor device according to claim 13, that emits white light composed of light of the first wavelength range and light of the second and third wavelength ranges and has a color rendering index of greater than or equal to 70 at a color temperature of greater than or equal to 3000 K and less than or equal to 6500 K.

15. A streetlamp comprising a light-emitting semiconductor device according to claim 12.

16. The light-emitting semiconductor device according to claim 12, wherein the first wavelength range has a dominant wavelength of greater than or equal to 445 nm and less than or equal to 455 nm.

* * * * *